United States Patent [19]
Ichihara

[11] Patent Number: 5,455,384
[45] Date of Patent: Oct. 3, 1995

[54] HIGH FREQUENCY MODULE AND METHOD OF PRODUCING THE SAME

[75] Inventor: Masaki Ichihara, Tokyo, Japan

[73] Assignee: NEC Corporation, Tokyo, Japan

[21] Appl. No.: 217,963

[22] Filed: Mar. 25, 1994

[30] Foreign Application Priority Data

Mar. 25, 1993 [JP] Japan .................. 5-090895

[51] Int. Cl.⁶ .................................. H01L 23/28
[52] U.S. Cl. ............. 174/52.2; 29/835; 29/841; 257/698
[58] Field of Search .............. 174/52.2, 35 R, 174/35 GC, 35 MS, 52.1, 52.3, 52.4; 29/831, 832, 835, 841, 855, 856, 858, 865, 866; 257/690, 693, 698, 787

[56] References Cited

U.S. PATENT DOCUMENTS

| 5,030,800 | 7/1991 | Kawakami et al. | 174/264 |
| 5,032,803 | 7/1991 | Koch | 29/830 X |
| 5,043,848 | 8/1991 | Rogers et al. | 361/424 |
| 5,177,324 | 1/1993 | Carr et al. | 174/35 R |
| 5,294,897 | 3/1994 | Notani et al. | 29/832 X |

FOREIGN PATENT DOCUMENTS

| 57-034354 | 6/1982 | Japan . |
| 59-051555 | 7/1984 | Japan . |
| 59-186397 | 10/1984 | Japan . |
| 4-042598 | 5/1992 | Japan . |
| 5-082393 | 8/1993 | Japan . |

Primary Examiner—Leo P. Picard
Assistant Examiner—Christopher Horgan
Attorney, Agent, or Firm—Foley & Lardner

[57] ABSTRACT

A method of producing a high frequency module comprises the steps of connecting leads to a circuit board, covering the circuit board with an insulating member such that the leads protrude from the insulating member, cutting off portions of the leads protruding from the insulating member having been molded, forming a metal film on the entire periphery of the insulating member, and removing the metal film around the leads to thereby form electrodes which are separate from the other portions of the metal film. The metal film is formed by evaporation, spraying or plating while the portions of the metal film around the leads are removed by chemical etching or machining. Further, the leads are connected to the circuit board on the same surface as electronic parts. The circuit board is covered with the insulating member in a rectangular parallelepiped configuration. The electrodes individually extend from the sides where the leads are present to the surface contiguous with the sides.

5 Claims, 4 Drawing Sheets

HIGH FREQUENCY MODULE AND METHOD OF PRODUCING THE SAME

BACKGROUND OF THE INVENTION

The present invention relates to a high frequency module for use in, for example, a radio communication apparatus as a high frequency signal processing device and, more particularly, to a high frequency module having a circuit board carrying electronic parts thereon, an insulating member covering the circuit board, a metal film or shield formed on the insulating member, and electrodes, and a method of producing the same.

A problem with a conventional radio communication apparatus is that spurious radiations (wave leakage) from a high frequency processing circuit, e.g., oscillation circuit turn round to cause the other circuits to oscillate also. Another problem is that noise causes the apparatus to malfunction. To eliminate these problems, it has been customary to provide the oscillation circuit with a shield. The shield is implemented by, for example, metal plates which are bonded together in a partitioning structure. This kind of shield is used to shield a high frequency amplifier circuit, oscillation circuit, control circuit or similar device. Specifically, a metal plate is soldered at one end to a ground pattern provided on a circuit board which carries electronic parts thereon, thereby surrounding the device. Another metal plate covers the top of the device. The metal plates, e.g., silver-plated copper plates have their adjoining ends connected together by screws or rivets or by solder. However, this kind of approach has a drawback that the shield structure is complicated and troublesome to produce, resulting in an increase in cost.

In light of the above, Japanese Patent Laid-Open Publication No. 59-186397 teaches a composite IC (Integrated Circuit) made up of a plurality of molded modules. The molded modules are mounted on a circuit board and electrically connected together by a circuit pattern to constitute desired circuitry. However, this approach brings about another problem that spurious radiations occur from the circuit pattern, which interconnects the modules, and affect the other circuits or even an external apparatus.

SUMMARY OF THE INVENTION

It is, therefore, an object of the present invention to provide a high frequency module which is entirely shielded to allow a minimum of spurious radiation to occur and is easy to produce, and a method of producing such a module.

In accordance with the present invention, a method of producing a high frequency module comprises the steps of connecting leads to a circuit board on which electronic parts are mounted. The circuit board is covered with an insulating member such that the leads protrudes from the insulating member. Portions of the leads protruding from the insulating member are cut off, A metal film is formed on the entire periphery of the insulating member. The metal film around the leads is removed to thereby form electrodes which are separate from the other portions of the metal film.

The metal film is formed by evaporation, spraying or plating while the above-mentioned portions of the metal film are removed by chemical etching or machining.

The leads are connected to the circuit board on the same surface as the electronic parts. The circuit board is covered in a rectangular parallelepiped configuration. The electrodes are formed such that they individually extend from the sides where the leads are present to the surface contiguous with the sides.

Also, in accordance with the present invention, a high frequency module comprises a plurality of high frequency modules produced by the above-described method. The high frequency modules have respective electrodes on bonding surfaces thereof abutted against and electrically connected to each other, whereby a composite high frequency module is produced.

When the high frequency modules are to be bonded to each other electrodes abutting, against each other on bonding surfaces of the modules are connected by soldering.

BRIEF DESCRIPTION OF THE DRAWINGS

The above and other objects, features and advantages of the present invention will become more apparent from the following detailed description taken with the accompanying drawings in which.

DETAILED DESCRIPTION OF THE PREFERRED EMBODIMENTS

Figure 1:
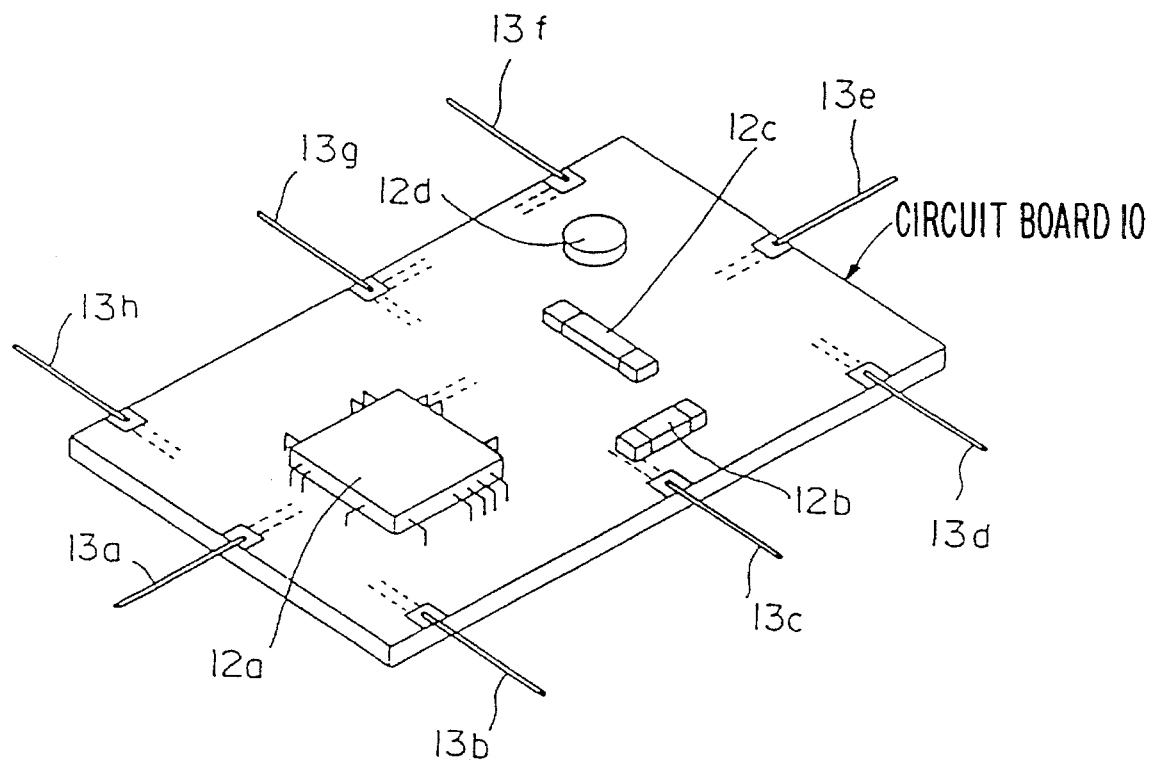
FIG. 1 is a perspective view of a circuit board carrying electronic parts thereon and included in a high frequency module embodying the present invention.

Referring to FIGS. 1–4, a high frequency module embodying the present invention and a method of producing the same will be described. To begin with, a circuit board on which electronic parts are packaged is fabricated. Specifically, FIG. 1 shows a circuit board 10 on which electronic parts and leads are connected. In the illustrative embodiment, electronic parts 12a, 12b, 12c and 12d including, for example, a flat package LSI (Large Scale Integrated Circuit) and chip resistors, are mounted on a circuit board 10. Leads 13a, 13b, 13c, 13d, 13e, 13f, 13g and 13h are connected to the ends of a circuit pattern also provided on the circuit board 11.

Figure 2:
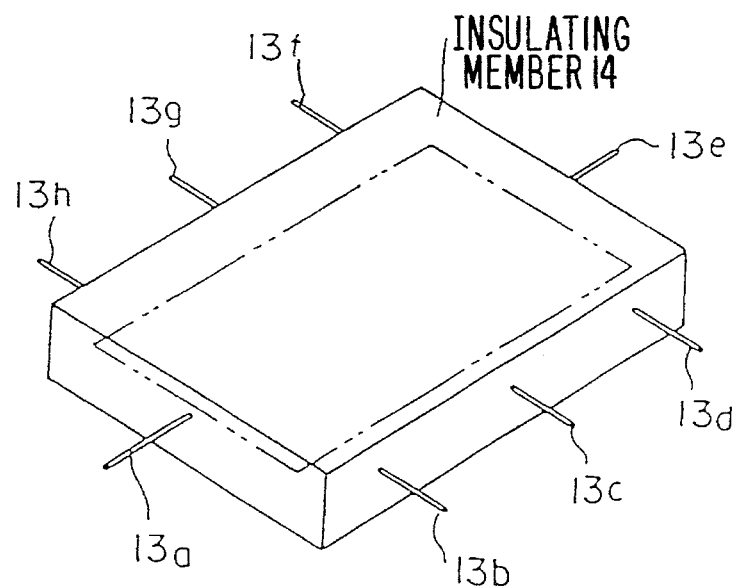
FIG. 2 is a perspective view showing the circuit board in a molded condition.

The circuit board 10 carrying the above-mentioned electronic parts and leads thereon is molded, as shown in FIG. 2. As shown, the circuit board 10 is covered with an insulating member 14. For example, after the leads have been received in a metal mold, the circuit board 10 may be molded together with a resin or ceramic by insertion molding to have a rectangular parallelepiped shape. Alternatively, after the circuit board 10 has been received in a metal mold, an insulator may be filled in the mold to cover the circuit board 10 in a rectangular parallelepiped configuration. Which of the resin, ceramic and insulator should be selected depends on the frequency loss, thermal damage and other factors of desired circuitry.

Figure 3:
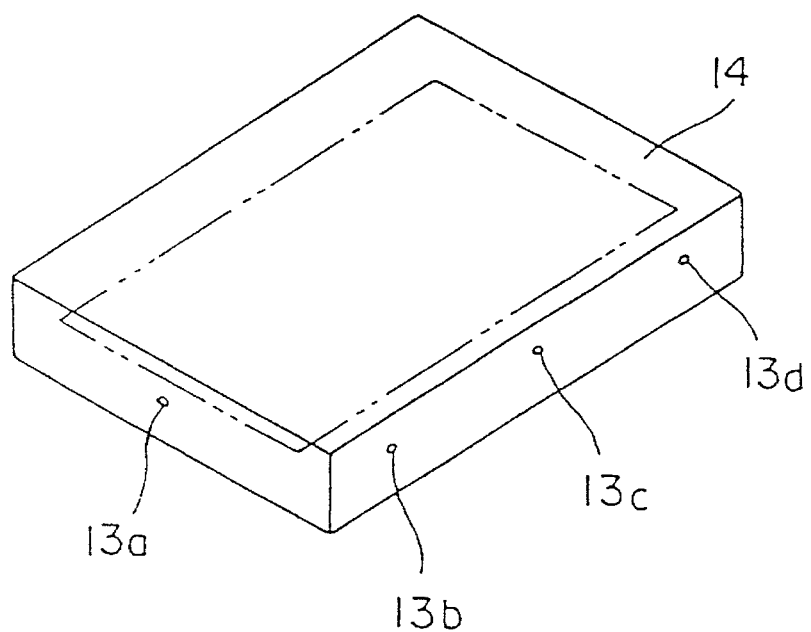
FIG. 3 is a perspective view showing the molding of FIG. 2 from which leads have been cut off.
Figure 4:
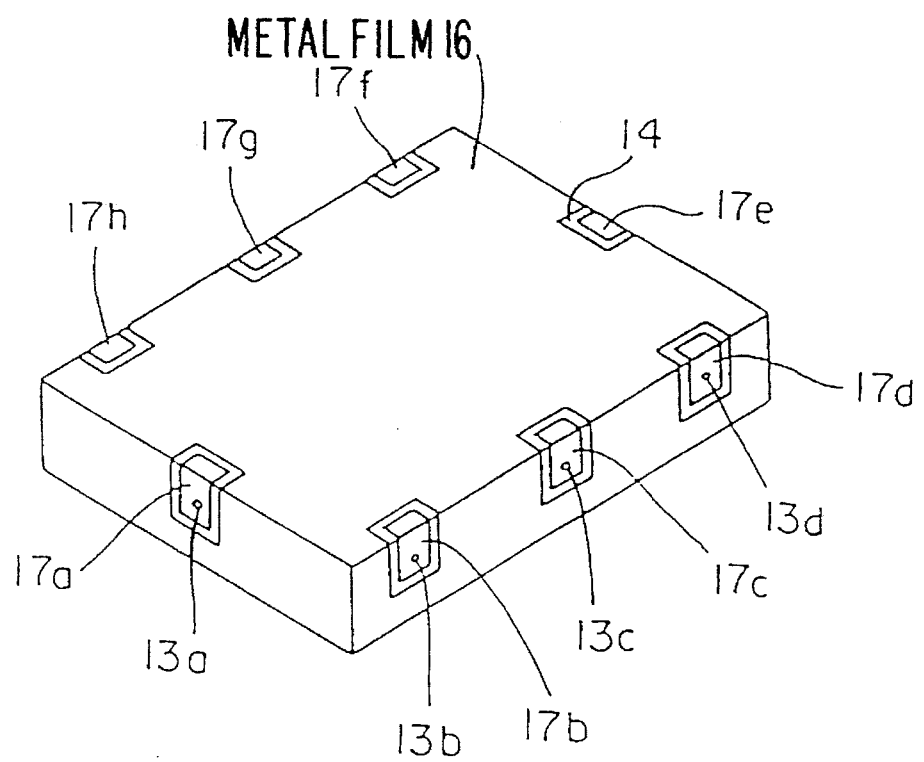
FIG. 4 is a perspective view showing a metal film and electrodes formed on an insulating member shown in FIG. 3.

Subsequently, the leads 13a–13h protruding from the edges of the resulting molding, i.e., insulating member 14 are cut off, as shown in FIG. 3. For this purpose, use may be made of, for example, a press capable of cutting off the leads 13a–13h at the same time. Thereafter, a metal film is formed on the surface of the insulating member 14, and then electrodes are formed on the metal film. Specifically, as shown in FIG. 4, a metal film 16 is formed on the entire surface of the insulating member 14, from which the leads 13a–13b have been removed, by evaporation, spraying, plating or similar conventional technology. As a result, a shield covering the circuit board 10 is formed. Then, the metal film 16 is removed around the cut portions of the leads 13a–13h to form electrodes 17a, 17b, 17c, 17d, 17e, 17f, 17g and 17h. The electrodes 17a–17h each has a generally L-shaped section, i.e., each of them extends from around the associated lead to the upper surface of the circuit board 10. The electrodes 17a–17g allow voltages to be applied to the circuit board 10 therethrough and allows signals to be input to and output from the circuit board 10.

The high frequency module fabricated by the above procedure is mounted on a mother board or similar circuit board, not shown, which is included in a desired apparatus. The electrodes 17a–17h are each soldered, by reflow or similar process, to a particular circuit pattern provided on the mother board, thereby implementing the application of voltages and the input and output of signals. At the same time, the metal film is soldered to a ground pattern, not shown, also provided on the mother board so as to play the role of a shield. The high frequency module with such a configuration allows a minimum of spurious radiation to occur and can be provided with any desired number of circuits.

Figure 5:
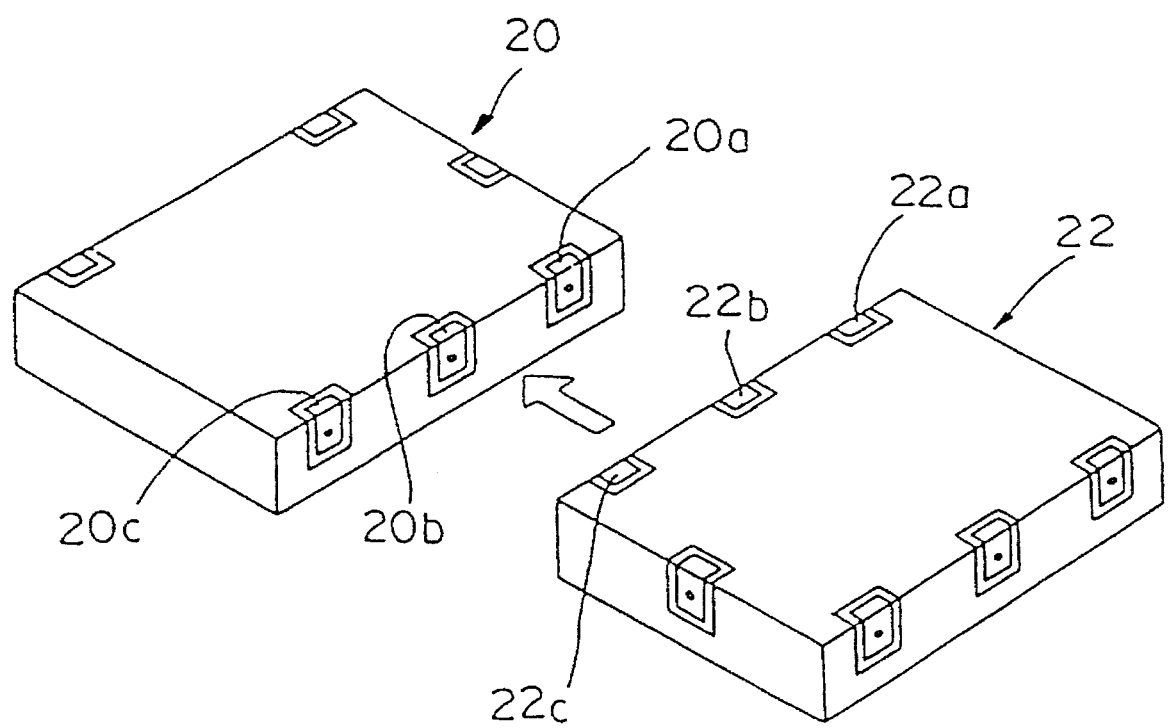
FIG. 5 is a perspective view showing an alternative embodiment of the present invention in which a plurality of high frequent modules are bonded together.

FIG. 5 shows an alternative embodiment of the present invention. As shown, high frequency modules 20 and 22 are identical or difference in internal circuit configuration with or from each other and connected to each other to form a plurality of desired circuits. The modules 20 and 22 may respectively constitute a section for processing a signal to be transmitted and a section for processing a signal received by way of example. The modules 20 and 22 are bonded together at their sides while electrodes 20a, 20b and 20c of the former and electrodes 22a, 22b and 22c of the latter are respectively connected by soldering. In this case, the electrodes 20a–20c and the electrodes 22a–22c are, of course, provided with electrically connectable internal configurations.

Figure 6:
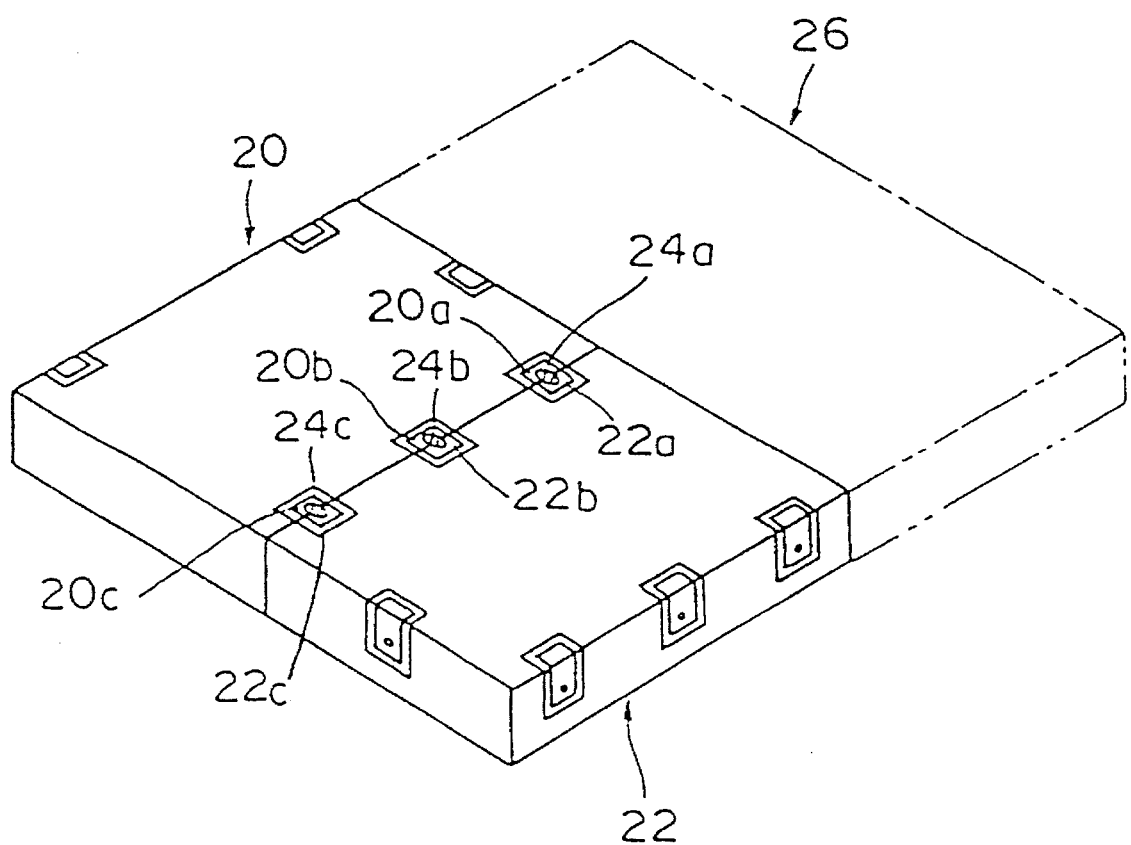
FIG. 6 is a perspective view showing a plurality of high frequency modules whose electrodes are soldered to complete a composite high frequency module.

FIG. 6 shows the modules 20 and 22 having their electrodes 20a–20c and 22a–22c soldered together by solders 24a–24c, respectively; together with another high frequency module 26. As shown, the module 26 has a larger circuit scale than the modules 20 and 22 and may be connected to the modules 20 and 22 to increase the overall circuit scale. In this way, a plurality of high frequency modules, each having the metal film or shield 16 and being identical or different in internal circuit configuration with or from the others, can be freely combined to implement a desired number of circuits easily. The resulting circuitry also suffers from a minimum of spurious radiation.

In the embodiments shown in FIGS. 5 and 6, desired circuitry is achievable only if the electrodes facing each other are connected. This reduces spurious radiations effectively, compared to the conventional modules which have to be connected by leads, mounted on a circuit board, and then connected by circuit patterns.

While the modules 20 and 22 are shown in FIG. 5 as being bonded at their sides, they may be stacked one upon the other, if desired. Such an alternative arrangement will reduce the area which the assembly occupies in the horizontal direction.

Further, although all the modules 20, 22 and 26 have been shown and described as having a rectangular parallelepiped configuration, such a configuration is only illustrative and not limitative. For example, each module may be provided with a shape matching the shape of the circuit board. When the module is provided with, for example, projections and recesses, electrodes may be formed on the projections and directly connected to signal input/output terminals provided on a chassis.

In summary, it will be seen that the present invention provides a method capable of fabricating a high frequency module which is entirely shielded and, therefore, sparingly suffers from spurious radiations. To achieve this advantage, the method covers a circuit board, to which leads have been connected, with an insulating member in a rectangular parallelepiped configuration, cuts off the leads protruding from the surfaces of the insulating member, covers the entire surfaces of the insulating member with a metal film, and then forms electrodes by removing the metal film around the leads such that each electrode extends to the upper surface of the insulating member.

Also, a plurality of modules fabricated by the above procedure are bonded together at their sides and have their electrodes facing each other soldered or otherwise connected. This realizes a large scale, composite module easily which allows a minimum of spurious radiation to occur and forms a desired number of circuits.

Various modifications will become possible for those skilled in the art after receiving the teachings of the present disclosure without departing from the scope thereof.

What is claimed is:

1. A method of producing a high frequency module, comprising the steps of:

(a) connecting leads to a circuit board on which electronic parts are mounted;

(b) covering said circuit board with an insulating member such that said leads protrudes from said insulating member;

(c) cutting off portions of said leads protruding from said insulating member;

(d) forming a metal film on entire periphery of said insulating member; and (e) removing said metal film around said leads to thereby form electrodes which are separate from the other portions of said metal film.

2. A method as claimed in claim 1, wherein step (d) comprises forming said metal film by one of evaporation, spraying and plating, step (e) comprising removing said portions of said metal film by chemical etching or machining.

3. A method as claimed in claim 1, wherein step (a) comprises connecting said leads to said circuit board on a same surface as said electronic parts, step (b) comprising covering said circuit board in a rectangular parallelepiped configuration, step (e) comprising forming said electrodes such that said electrodes individually extend from sides where said leads are present to said surface contiguous with said sides.

4. A high frequency module, comprising a plurality of high frequency modules produced by a method as claimed in claim 1, said plurality of high frequency modules having respective electrodes on bonding surfaces abutted against and electrically connected to each other, whereby a composite high frequency module is produced.

5. A high frequency module as claimed in claim 4, wherein when said plurality of high frequency modules are to be bonded to each other, electrodes abutting against each other on bonding surfaces of said modules are connected by soldering.

* * * * *